US 8,541,801 B2
United States Patent
Kim et al.

(10) Patent No.: US 8,541,801 B2
(45) Date of Patent: Sep. 24, 2013

(54) LIGHT-EMITTING-DEVICE PACKAGE AND A METHOD FOR PRODUCING THE SAME

(75) Inventors: Jin Ha Kim, Seoul (KR); Masami Nei, Gyunggi-do (KR); Seok Min Hwang, Busan (KR); Chung Bae Jeon, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 65 days.

(21) Appl. No.: 13/142,950

(22) PCT Filed: Dec. 30, 2009

(86) PCT No.: PCT/KR2009/007936
§ 371 (c)(1),
(2), (4) Date: Jul. 25, 2011

(87) PCT Pub. No.: WO2010/077082
PCT Pub. Date: Jul. 8, 2010

(65) Prior Publication Data
US 2011/0291143 A1 Dec. 1, 2011

(30) Foreign Application Priority Data

Dec. 30, 2008 (KR) .................. 10-2008-0136954
Dec. 28, 2009 (KR) .................. 10-2009-0132239

(51) Int. Cl.
*H01L 33/00* (2010.01)
(52) U.S. Cl.
USPC ............... 257/98; 257/E23.116; 257/E23.128

(58) Field of Classification Search
USPC ............ 257/94–100, 676, E25.032, E23.001, 257/E23.116, E23.128
See application file for complete search history.

(56) References Cited

U.S. PATENT DOCUMENTS

| 6,531,328 | B1 | 3/2003 | Chen |
| 2008/0074032 | A1 | 3/2008 | Yano et al. |
| 2008/0093614 | A1 | 4/2008 | Nagai |
| 2008/0179611 | A1* | 7/2008 | Chitnis et al. .................. 257/98 |
| 2008/0191608 | A1* | 8/2008 | Schmidt ........................ 313/503 |
| 2010/0096653 | A1 | 4/2010 | Kim et al. |

FOREIGN PATENT DOCUMENTS

| CN | 1421936 A | 6/2003 |
| CN | 1918691 A | 2/2007 |
| CN | 2888653 Y | 4/2007 |
| JP | 2002-374007 A | 12/2002 |
| JP | 3685018 B2 | 8/2005 |
| JP | 2005-317881 A | 11/2005 |
| KR | 10-2007-0063976 A | 6/2007 |

(Continued)

OTHER PUBLICATIONS

International Search Report for PCT/KR2009/007936 issued Aug. 23, 2010 [PCT/ISA/210].

(Continued)

*Primary Examiner* — Brook Kebede
(74) *Attorney, Agent, or Firm* — Sughrue Mion, PLLC

(57) ABSTRACT

A light emitting device package includes: a substrate with a mounting surface; a light emitting device bonded to the mounting surface of the substrate; a light reflecting resin part containing a high reflective material, filled on the substrate around the light emitting device so as to extend in a space between the light emitting device and the substrate; and a packing resin part hermetically sealed to cover the light emitting device and the light reflection resin part.

32 Claims, 8 Drawing Sheets

(56) References Cited

FOREIGN PATENT DOCUMENTS

| | | |
|---|---|---|
| KR | 10-2007-0069669 A | 7/2007 |
| TW | 200824158 | 6/2008 |
| TW | 200838927 | 10/2008 |
| WO | 2005062905 A2 | 7/2005 |
| WO | 2008073682 A1 | 6/2008 |

OTHER PUBLICATIONS

Communication, dated Oct. 17, 2012, issued by the Taiwanese Patent Office in corresponding Taiwanese Application No. 098145727.
Communication dated Feb. 21, 2013, issued by the State Intellectual Property Office of P.R. China in counterpart Chinese Patent Application No. 200980156159.X.

* cited by examiner (a)

(b)

LIGHT-EMITTING-DEVICE PACKAGE AND A METHOD FOR PRODUCING THE SAME

TECHNICAL FIELD

The present invention relates to a light emitting device package and, more particularly, to a light emitting device package capable of improving luminous efficiency, and a fabricating method thereof.

BACKGROUND ART

Recently, a nitride light emitting device, a light emitting diode for acquiring light of a blue or green wavelength range, is fabricated with a semiconductor material having an empirical formula of AlxInyGa(1-x-y)N (here, $0 \leq x \leq 1$, $0 \leq y \leq 1$, $0 \leq x+y \leq 1$). As such an LED has various advantages such as along life span, low power consumption, good initial driving characteristics, high vibration resistance, and the like, compared with a light emitting device based on a filament, demand for the LED continues to increase, and the recent active development of a high output LED promotes the use of the LED in diverse application fields such as an automobile light source, an electronic board, illumination, a light source for a backlight unit of a display, and the like.

In order to meet consumer demand, an LED package needs to have high luminance light emission characteristics. In general, the form of an LED package varies depending on an LED structure. First, when the LED has a structure in which a p-side electrode and an n-side electrode are formed on the same surface, the LED can be mounted on a sub-mount substrate through flip chip bonding. Thereafter, an underfill is performed to fill a resin member between the LED and the sub-mount substrate. Accordingly, the connection portion connecting the LED and the sub-mount substrate is protected by the resin member. The LED is then hermetically sealed with a silicon resin so as to be entirely covered. In the LED package having the flipchip structure, light generated from the LED is emitted in the opposite direction of the electrode surface. Until the light generated from the LED is discharged to an outer side, the light is reflected and diffused many times so as to be made incident on the surface of the sub-mount substrate. In this case, if the sub-mount substrate has low reflexibility, it absorbs the light, causing a loss of the light. Thus, it is preferable to employ a sub-mount substrate having high reflexibility. In this respect, however, in the case of a high output LED applying a high current in terms of the characteristics of an LED package, selection of a material having a high heat releasing characteristics and a material having a thermal expansion coefficient similar to that of the LED chip is a significant factor, so it may not be easy to select a substrate material having a high reflexibility. Also, a large amount of photons generated from the LED are absorbed and become extinct at the inner side of the underfill resin member. Namely, because light emitted from the LED is absorbed to become extinct by the underfill resin member surrounding the LED chip, it cannot easily come out of the LED package, degrading light output.

Meanwhile, as for different types of LED packages, in the case of an LED having a structure in which a p-side electrode and a n-side electrode are formed on the same surface, a growth substrate is die-bonded to a lead frame molded to a package main body so as to be mounted, and in the case of an LED having a structure in which a p-side electrode and an n-side electrode are formed on the opposite surfaces perpendicular to each other, a conductive substrate is die-bonded to a lead frame molded to a package main body so as to be mounted. Thereafter, the LED is hermetically sealed with a silicon resin so as to be entirely covered. In this type of LED package, until the light generated from the LED is discharged to an outer side after passing through the silicon resin, the light is reflected and diffused many times and made incident to the opaque conductive substrate, a die-bonding adhesive, the package main body, and the like, so as to be absorbed, causing a loss of light.

Thus, a package structure and method capable of preventing a loss of light caused as a light absorption due to a low reflexibility of the packaging material of the LED package are required.

DISCLOSURE

Technical Problem

An aspect of the present invention provides a light emitting device package capable of preventing a loss of light emitted from a light emitting device to thereby improve light extraction efficiency and thus enhance luminous efficiency.

Another aspect of the present invention provides a method for fabricating the light emitting device package.

Technical Solution

According to an aspect of the present invention, there is provided a light emitting device package including: a substrate with a mounting surface; a light emitting device bonded to the mounting surface of the substrate; a light reflecting resin part containing a high reflective material, formed in a space between the light emitting device and the substrate, and extending from a region formed at the space so as to be formed on the substrate around the light emitting device; and a packing resin part hermetically sealed to cover the light emitting device and the light reflecting resin part.

The light reflecting resin part may be formed on an area of 50 percent or more when compared to the entire area of the substrate excluding the region on which the light emitting device is bonded. The light reflecting resin part may be formed on a front surface of the substrate. The light reflecting resin part may be formed to also cover the side surface of the light emitting device. The substrate may be a sub-mount substrate.

The light emitting device may include: a light emission structure including a first conductive semiconductor layer, an active layer, and a second conductive semiconductor layer which are sequentially formed on a growth substrate and having a mesa structure in which a portion of the first conductive semiconductor layer is exposed; a first conductive electrode formed on the exposed portion of the first conductive semiconductor; and a second conductive electrode formed on the second conductive semiconductor layer. The light emitting device may further include: a high reflective ohmic-contact layer formed on the second conductive semiconductor layer. The light emitting device may further include: a bonding pad formed on the substrate; and a metal bump formed on the bonding pad and electrically connected with the first and second conducive electrodes, wherein the substrate may further include a conductive via electrically connected with the bonding pad.

According to another aspect of the present invention, there is provided a light emitting device package including: a package main body having a cavity; first and second lead frames coupled with the package main body such that the first and second lead frames are exposed from a lower surface of the cavity and face each other; at least one light emitting device mounted on one surface of the first and second lead frames; a wire electrically connecting a lead frame among the first and second lead frames where the light emitting device is not mounted and the light emitting device; a light reflecting resin part coated with a thickness smaller than that of the light emitting device between a side surface of the light emitting device and a side wall of the cavity and containing a high reflective material; and a packing resin part hermetically sealed at an inner side of the cavity to cover the light emitting device.

The cavity may have a step portion, and the step portion has a height smaller than the thickness of the light emitting device. The light emitting device may include: a light emission structure including a first conductive semiconductor layer, an active layer, and a second conductive semiconductor layer which are sequentially stacked; a conductive substrate formed on the second conductive semiconductor layer; and a first conductive electrode formed on a lower surface of the first conductive semiconductor layer. Also, the light emitting device may include: a light emission structure including a first conductive semiconductor layer, an active layer, and a second conductive semiconductor layer which are sequentially formed on a growth substrate and having a mesa structure in which a portion of the first conductive semiconductor layer is exposed; a first conductive electrode formed on the exposed portion of the first conductive semiconductor; and a second conductive electrode formed on the second conductive semiconductor layer.

In the light emitting device package, the light reflecting resin part may include the high reflective material so as to have a diffusion reflectance of 70 percent or larger. The high reflective material may have electrical insulation characteristics and may be $TiO_2$ or $Al_2O_3$. The high reflective material may be powder particles. The powder particles may be coated to restrain a photocatalyst reaction. The packing resin part may include a phosphor material or a quantum dot.

According to another aspect of the present invention, there is provided a method for fabricating a light emitting device package including: sequentially forming a bonding pad and a metal bump on a substrate; flipchip-bonding a light emitting device on the metal bump; forming a light reflecting resin part containing a high reflective material, filling a space between the light emitting device and the substrate, and extending to the vicinity of the light emitting device on the substrate; and dicing the substrate so as to be separated into individual light emitting device packages.

The method for fabricating a light emitting device package may further include: forming a packing resin part to cover the light emitting device and the light reflecting resin part before separating the substrate into the individual light emitting device packages. In forming the light reflection resin part, the light reflecting resin part may be formed on an area of 50 percent or more when compared to the entire area of the substrate excluding the region on which the light emitting device is bonded. In forming the light reflection resin part, the light reflecting resin part may be formed on a front surface of the substrate. In forming the light reflection resin part, the light reflecting resin part may be formed to also cover a side surface of the light emitting device.

According to another aspect of the present invention, there is provided a method for fabricating a light emitting device package including: preparing a package main body having a cavity such that the cavity has a step portion on an upper surface thereof; coupling first and second lead frames to the package main body such that they are exposed from a lower surface of the cavity and face each other; mounting a light emitting device on an upper surface of one of the first and second lead frames through die bonding; forming a wire to electrically connect the light emitting device with a lead frame on which the light emitting device is not mounted among the first and second lead frames; forming a light reflecting resin part containing a high reflective material with a thickness smaller than that of the light emitting device such that the light reflecting resin part is coated on a side surface of the light emitting device and on a side wall of the cavity; and forming a packing resin part at an inner side of the cavity to cover the light emitting device. In preparing the package main body, the cavity may be formed to have a step portion. The step portion may be formed to have a height not larger than the thickness of the light emitting device from the lower surface of the cavity.

The high reflective material may be $TiO_2$ or $Al_2O_3$. The high reflective material may be powder particles. The powder particles may be coated to restrain a photocatalyst reaction. The packing resin part may include a phosphor material or a quantum dot.

The method for fabricating a light emitting device package may further include: applying heat to harden the light reflecting resin part and the packing resin part after forming the light reflecting resin part and forming the packing resin part.

Advantageous Effects

As set forth above, according to exemplary embodiments of the invention, a light reflecting resin part including a high reflective material is coated to cover a lower portion of the light emitting device or a side surface of the light emitting device and the vicinity of the light emitting device, thereby reducing light absorption by a resin member and packaging materials and increasing a surface reflexibility to thus improve a luminous efficiency.

MODE FOR INVENTION

Figure 1:
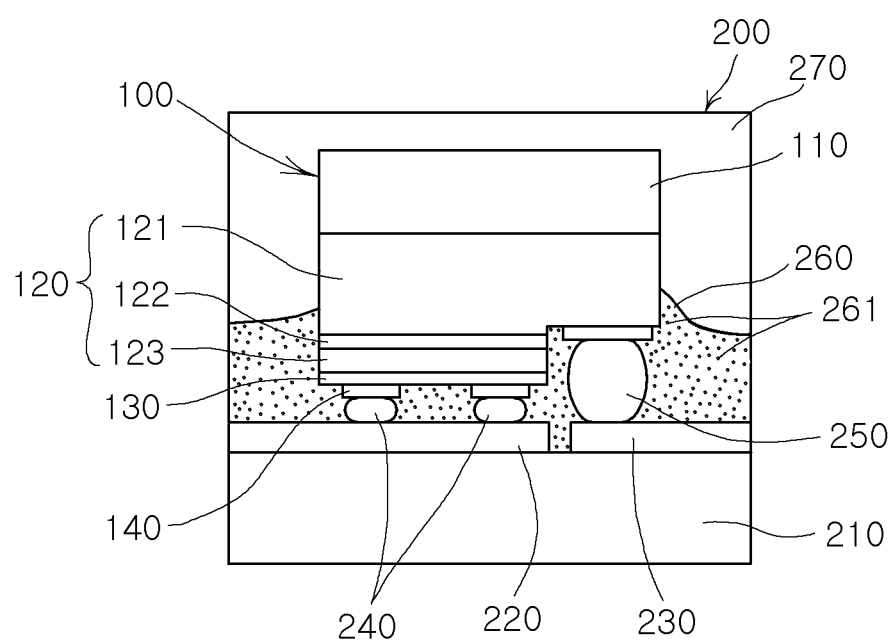
FIG. 1 is a side sectional view schematically showing a light emitting device package according to a first exemplary embodiment of the present invention.
Figure 2:
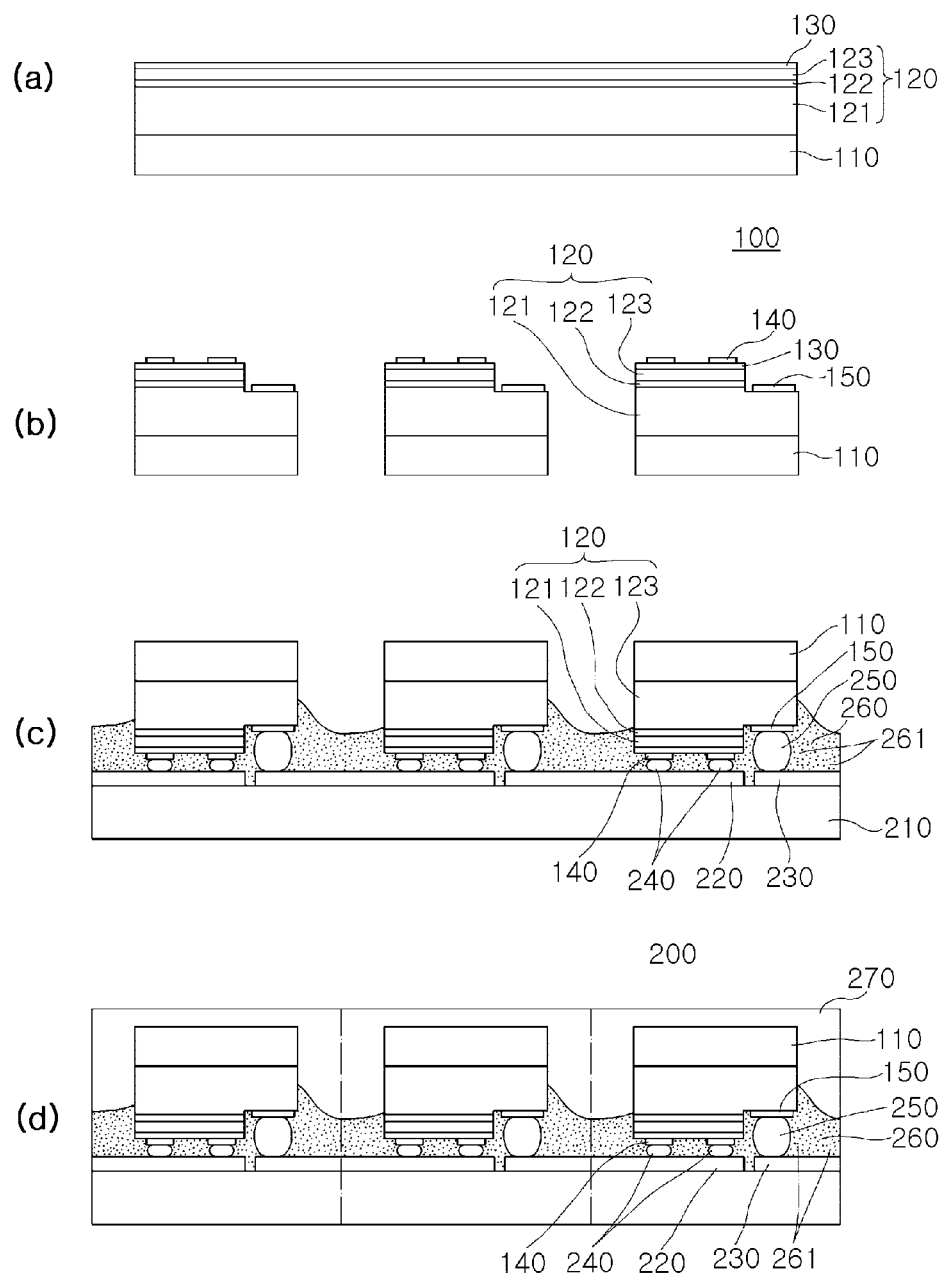
FIGS. 2a to 2d are side sectional views illustrating a sequential process of a method for fabricating the light emitting device package of FIG. 1 according to the first exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a side sectional view schematically showing a light emitting device package according to a first exemplary embodiment of the present invention. Here, the first exemplary embodiment of the present invention is a light emitting device package having a structure in which a light emitting device is flipchip-bonded. In this case, the light emitting device has a structure in which first and second conductive electrodes are formed on the same surface.

As shown in FIG. 1, a light emitting device package 200 according to the present exemplary embodiment includes a light emitting device 100 flipchip-bonded on a substrate 210, and also includes a light reflecting resin part 260 filled in a space between the light emitting device 100 and the substrate 210 and filled on a front surface of the substrate 210, and a packing resin part 160 hermetically sealing the entirety of the light emitting device 100 and the substrate 210.

The light emitting device 100 may be a semiconductor device electrically mounted on the substrate 210 and may output light of a certain wavelength by power applied from an external source, and may be a light emitting diode (LED). The light emitting device 100 includes a light emission structure 120 in which a first conductive semiconductor layer 121, an active layer 122, and a second conductive semiconductor layer 123 are sequentially stacked. The light emission structure 120 has a structure such that the active layer 122 and the second conductive semiconductor layer 123 are mesa-etched to expose a region of the first conductive semiconductor layer 121. A first conductive electrode 150 and a second conductive electrode 130 are formed on the exposed first conductive semiconductor layer 121 and on the second conductive semiconductor layer 123, respectively, of the light emission structure 120. Here, a plurality of second conductive electrodes 130 may be formed in order to spread current. A growth substrate 110 refers to general wafer for fabricating a light emitting device. As the growth substrate 110, a transparent substrate such as $AL_2O_3$, $ZnO$, $LiAl_2O_3$ may be used, and in the present exemplary embodiment, a sapphire substrate is used.

Although not shown, the light emitting device 100 may include a low temperature nuclear growth layer including AlN or GaN as a buffer layer formed on the growth substrate 110 in order to reduce lattice-mismatching with the sapphire substrate.

Also, in the light emitting device 100, a high reflective ohmic-contact layer 130 may be formed on the second conductive semiconductor layer 123 in order to reflect light, which is emitted toward the second conductive electrode 140, upwardly. The high reflective ohmic-contact layer 130 is made of a material that lowers a contact resistance with the second conducive semiconductor layer 123 having a relatively large energy band gap and has a high reflexibility in consideration of the structural aspect of the light emitting device package having a flipchip structure. Namely, the high reflective ohmic-contact layer 130 may be formed with a material selected from the group consisting of Ag, Ni, Al, Ph, Pd, Ir, Ru, Mg, Zn, Pt, Au, or combinations thereof. Preferably, the high reflective ohmic-contact layer 130 has a reflexibility of 70 percent or greater.

The substrate 210 includes bonding pads 220 and 230 to be bonded with the first and second conductive electrodes 150 and 140, respectively, of the light emitting device 100. Meal bumps 240 and 250 bond the light emitting device 100 and the bonding pads 220 and 230 of the substrate 210, thus electrically connecting the light emitting device 100 and the bonding pads 220 and 230. Here, the substrate 210 may be a sub-mount substrate.

The light reflecting resin part 260 is an underfill resin layer for protecting the attachment and bonding area of the light emitting device 100 and made of a mixture of a high reflective material 261 for diffuse-reflecting light generated from the interior, namely, from the active layer 122, of the light emitting device 100 and an insulating resin. The insulating resin may be a thermosetting resin, and preferably, it is silicon. The light reflecting resin part 260 may preferentially fill the space between the light emitting device 100 and the substrate 210 (namely, the lower side of the light emitting device 100) and extend to the side of the light emitting device 100 so as to be formed on a front surface of the substrate 210. Namely, the light reflecting resin part 260 is filled at the region where the first and second conductive electrodes 150 and 140 of the light emitting device 100, the bonding pads 220 and 230, and the metal bumps 240 and 250 are prepared, and serve to reinforce an adhesive strength of the light emitting device 100 and the substrate 210.

FIG. 1 illustrates the case where the light reflecting resin part 260 is formed at the lower side of the light emitting device 100 and on the front surface of the substrate 210, but the present invention is not meant to be limited thereto and the light reflecting resin part 260 may be formed only on at least a portion of the substrate 210 around the light emitting device 100, extending from the lower portion of the light emitting device 100. Namely, the light reflecting resin part 260 may include the lower portion of the light emitting device 100 and may be formed to be as large as an area of 50 percent or more when compared with the entire area of the substrate 210 excluding the lower portion of the light emitting device 100.

The high reflective material 261 has a form of a powder particle and, in this case, the powder particle may have a diameter ranging from 10 nm to 10 μm. In order to have a uniform or even distribution or dispersion of the high reflective material 261 in an insulating resin, preferably, the high reflective material 261 has a diameter of submicron (1 μm) or smaller. Also, the high reflective material 261 serves to diffuse-reflect light generated from the interior, namely, from the active layer 122, of the light emitting device 100 to allow the light to be discharged to the outside without light absorption by the underfill resin member or the substrate 210. To this end, preferably, the high reflective material 261 has a diffuse reflectance of 70 percent or more with respect to light, and may be $TiO_2$ or $Al_2O_3$.

The high reflective material 261 has electrical insulation characteristics and includes surface-treated particles, namely, coated particles, in order to improve dispersibility and restrain a photocatalyst reaction. Namely, if UV or BLUE short wavelength light generated from the interior of the light emitting device 100 is made incident to the light reflecting resin part 260, $TiO_2$ would decompose nearby organic molecules through catalysis, causing a yellowing phenomenon of the resin to thereby degrade luminous efficiency. Also, the high reflective material 261 would lump together, rather than being evenly distributed or dispersed within the resin, and sink to the surface of the substrate, making light in the resin absorbed rather than being reflected to degrade luminous efficiency. Thus, as the high reflective material 261, coated powder particles are used to prevent degradation of dispersibility and the occurrence of yellowing phenomenon of the resin due to the photocatalyst reaction.

In this manner, in the light emitting device package according to the first exemplary embodiment of the present invention, in order to prevent light absorption due to a low reflexibility of the substrate 210 and the underfill resin member, the light reflecting resin part 260, including the high reflective material 261, is coated at the lower portion of the light emitting device 100 and on the surface of the substrate 210, so that light generated from the active layer 122 of the light emitting device 100 can be diffuse-reflected by the high reflective material 261 so as to be discharged to outside. Namely, because the majority of light toward the light reflecting resin part 260 is reflected and induced toward the light extraction surface of the light emitting device, luminance efficiency can be improved.

FIGS. 2a to 2d are side sectional views illustrating a sequential process of a method for fabricating the light emitting device package of FIG. 1 according to the first exemplary embodiment of the present invention. Here, in the method for fabricating a light emitting device package, a plurality of light emitting device packages are fabricated by using a certain wafer, but it is illustrated in FIG. 2 that several light emitting device packages are fabricated for the sake of brevity, and the light emitting device packages have the same structure, so reference numerals are used only for a single light emitting device package in the following description.

As shown in FIG. 2(a), the first conductive semiconductor layer 121, the active layer 122, and the second conductive semiconductor layer 123 are sequentially stacked on the growth substrate 110 to form the light emission structure 120.

Here, the light emission structure 120 may be fabricated with a semiconductor material having an empirical formula of $Al_xIn_yGa_{(1-x-y)}N$ (here, $0 \leq x \leq 1$, $0 \leq y \leq 1$, $0 \leq x+y \leq 1$), and may be formed through various deposition and growth methods including Chemical Vapor Deposition (CVD), Metal Organic Chemical Vapor Deposition (MOCVD), Plasma-enhanced Chemical Vapor Deposition (PCVD), Molecular Beam Epitaxy (MBE), Hydride Vapor Phase Epitaxy (HVPE), and the like.

Subsequently, as shown in FIG. 2(b), the active layer 122 and the second conductive semiconductor layer 123 of the light emission structure 120 are partially removed through mesh etching to expose a portion of the first conductive semiconductor layer 121. The first conductive electrode 150 is formed on the first conductive semiconductor layer 121 exposed through the mesa etching.

The high reflective ohmic-contact layer 130 is then formed on the second conductive layer 123. The high reflective ohmic-contact layer 130 has a reflexibility of 70 percent or more and forms an ohmic-contact with the second conductive semiconductor layer 123. The high reflective ohmic-contact layer 130 is employed to improve luminous efficiency by reflecting light, which is made incident to the second conductive electrode 140, toward a light emission surface. The high reflective ohmic-contact layer 130 may be omitted.

Thereafter, the second conductive electrode 140 is formed on the high reflective ohmic-contact layer 130. When the high reflective ohmic-contact layer 130 is omitted, the second conductive electrode 140 may be formed immediately on the second conductive semiconductor layer 123. A dicing process is performed on the structure thusly formed in order to separate each light emitting device 100.

The process of fabricating the light emitting devices is not limited to the above-described method, and various modifications and various films may be added. For example, a plurality of high reflective ohmic-contact layers may be formed on the second conductive semiconductor layer 123, and a reflective layer may be additionally formed. Also, an ohmic-metal layer may be additionally formed on the first and second conductive semiconductor layers 121 and 123 in order to smoothly supply current.

Subsequently, as shown in FIG. 2(c), the separated light emitting devices 100 are mounted on the substrate 210. In this case, first, the bonding pads 220 and 230 on which the first and second conductive electrodes 140 and 150 of the light emitting device 100 to be bonded are formed on the substrate 210. Here, the substrate 210 may be made of SiC, Si, Ge, SiGe, AlN, metal, and the like, having good thermal conductivity. In particular, when the substrate 210 is made of AlN having good thermal conductivity and insulating qualities, a conductive via connected with the bonding pad is formed therein, and when the substrate 210 is made of a metal material having a high thermal conduction rate, an insulating layer needs to be formed on the substrate 210. In this case, the substrate 210 may be a sub-mount substrate.

The bonding pads 220 and 230 are made of metal having good electrical conductivity and are formed through a screen printing method or through a deposition process using a certain mask pattern.

Thereafter, metal bumps 240 and 250 are formed on the bonding pads 220 and 230 formed on the substrate 210. Here, the metal bump may be made of at least one of Pb, Sn, Au, Ge, Cu, Bi, Cd, Zn, Ag, Ni, and Ti, or their alloys. The metal bumps 240 and 250 may be also formed on the electrode of the LED chip 100, rather than being formed on the bonding pads 220 and 230 of the substrate 210.

And then, the first and second conductive electrodes 140 and 150 of the separated light emitting device are bonded to the metal bumps 240 and 250, respectively, to flipchip-bond the light emitting device 100 to the substrate 210. Here, the electrodes of the light emitting device 100 and the metal bumps may be bonded through various bonding methods. For example, the electrodes of the light emitting device 100 and the metal bumps may be bonded by using heat or ultrasonic waves or may be pressed to be bonded by using both heat and ultrasonic waves.

After the light emitting device 100 and the substrate 210 are electrically connected through the metal bumps 240 and 250 and the bonding pads 220 and 230, an underfill process is performed in order to prevent the oxidization of the metal bumps 240 and 250 and stably maintain an electrically connected state of the light emitting device 100 and the substrate 210.

In the underfill process, a light reflective resin member is preferentially injected into the space between the light emitting device 100 and the substrate 210 and extends to be coated up to a portion of the substrate 210 around the light emitting device 100, and is then hardened to form the light reflective resin part 260.

The light reflective resin part 260, a resin member obtained by mixing a resin and the high reflective material 261, may be filled between the light emitting device 100 and the substrate 210 (namely, at the lower portion of the light emitting device 100) and may be also coated on a portion of the side surface of the light emitting device 100. Also, the light reflective resin part 260 may be coated on the entire surface of the substrate 210 around the light emitting device 100, besides the lower portion of the light emitting device 100, and then hardened.

The light reflective resin part 260 will now be described in more detail. The light reflective resin part 260 is formed in a state that a high reflective material is uniformly dispersed within an insulating resin. In this case, the insulating resin is a thermosetting resin, and preferably, the insulating resin may be a silicon resin.

The high reflective material 261 diffuse-reflects light emitted from the light emitting device 100 to discharge it to outside, and has a form of a powder particle. The size of the powder particle ranges from 10 nm to 10 µm. In order to implement an even or uniform distribution or dispersion of the powder particles in the insulating resin, the powder particle preferably has a size of submicron (1 µm) or smaller.

As the high reflective material 261, surface-processed particles, namely, coated particles, are used to restrain a photo-catalyst reaction to thus improve dispersibility allowing the high reflective material 261 to be uniformly dispersed in the insulating resin, and prevent a yellowing phenomenon of the insulating resin. The high reflective material 261 may be made of $TiO_2$ or $Al_2O_3$.

Subsequently, as shown in FIG. 2(d), the light emitting device 100 flipchip-bonded to the substrate 210 and the light reflecting resin part 260 are covered and hermetically sealed by a transparent resin, forming a packing resin part 270, and the substrate 210 is separated into individual packages.

In detail, the transparent resin member is coated on the substrate 210 with the light emitting device 100 and the high reflection resin part 260 coated thereon in the resulting product formed as shown in FIG. 2(c), and hardened by applying heat thereto to form the packing resin part 270. In this case, the packing resin part 270 may include a phosphor material or quantum dot. As for the phosphor material, a blue phosphor may be selected from among $(Ba, Sr, Ca)_5(PO_4)_3Cl:(Eu^{2+}, Mn^{2+})$ and $Y_2O_3:(Bi^{3+}, Eu^{2+})$ and used, a nitride-based or sulfide-based red phosphor may be used, one of silicate-based, sulfide-based, and nitride-based green phosphor may be used, and a YAG or TAG-based garnet phosphor may be used as a yellow phosphor. The quantum dot represents colors from blue to red by adjusting the size of nano-particles and may be II-VI group compound semiconductor nano-crystal such as CdS, CdSe, CdTe, ZnS, ZnSe, ZnTe, HgS, HgSe, and HgTe. Accordingly, the packing resin part 270 can convert the wavelength of light emitted from the light emitting device 100 into white light by using the phosphor material or the quantum dot. And then, the substrate 210 is diced so as to be separated into the individual light emitting device packages 200 having the flipchip structure.

In this manner, because the light emitting device 100 is flipchip-bonded on the substrate 210 and the light reflective resin part 260 including the high reflective material 261 is formed in the space between the light emitting device 100 and the substrate 210 and on the surface of the substrate 210 around the light emitting device 100, light emitted from the active layer 122 of the light emitting device 100 is not absorbed to the underfill resin member and the substrate but collides with the high reflective material 261 so as to be diffuse-reflected, thus increasing the quantity of light (or the intensity of radiation) output to the outside and improving luminous efficiency.

Figure 3:
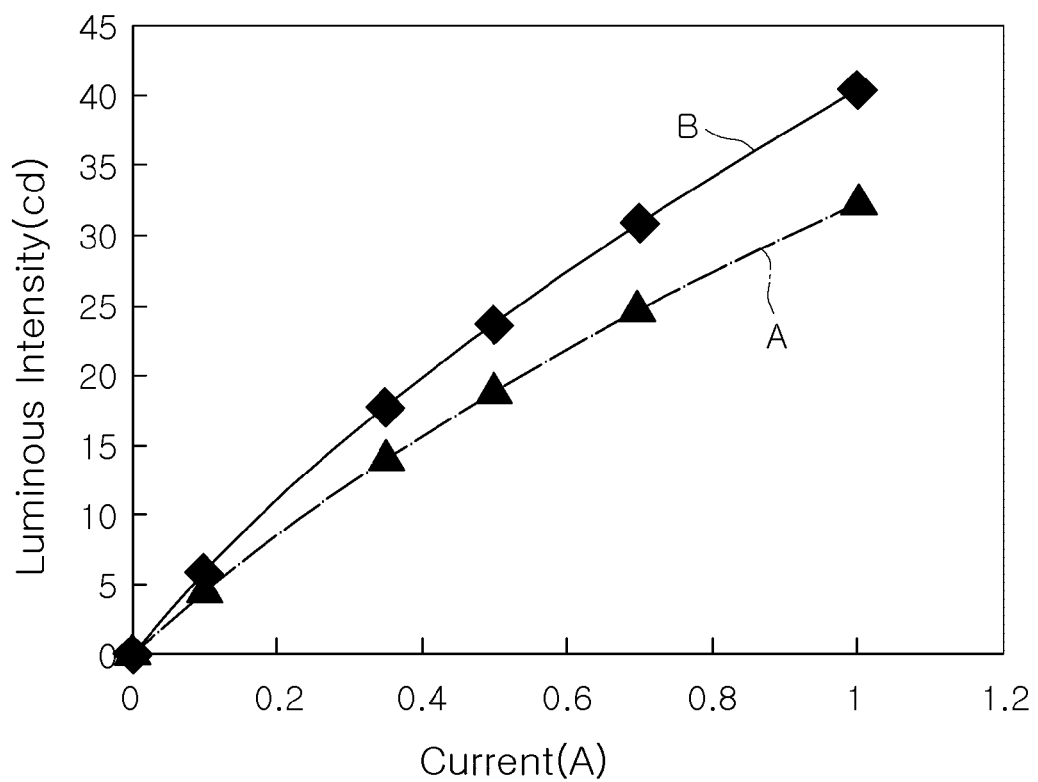
FIG. 3 is a graph showing a luminance enhancement effect of the light emitting device package according to the first exemplary embodiment of the present invention.

FIG. 3 is a graph showing a luminance enhancement effect of the light emitting device package according to the first exemplary embodiment of the present invention. Here, in the light emitting device package according to the first exemplary embodiment of the present invention, the substrate is made of AlN having a high heat releasing characteristics, a high reliability, and a low thermal expansion rate, the bonding pad is formed through gold-plating, and the light reflecting resin part is formed on the front surface of the substrate.

With reference to FIG. 3, it is noted that the light emitting device package (B) having the light reflecting resin part containing the high reflective material proposed in the present invention attains an effect of luminance improved by 25 percent compared to the related art light emitting device package (A) having a light reflecting resin part not containing a high reflective material.

Figure 4:
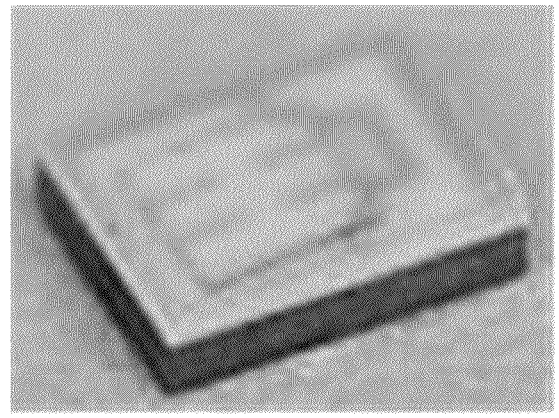
FIGS. 4a and 4b are photographs showing an actually driven state of the light emitting device package according to the first exemplary embodiment of the present invention and that of a general light emitting device package.
Figure 4:
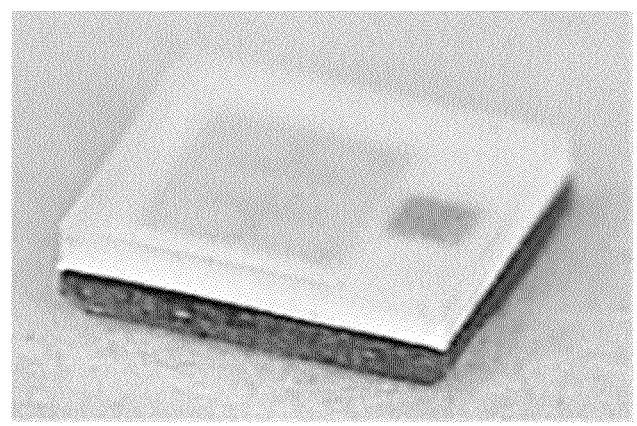

FIGS. 4a and 4b are photographs showing an actually driven state of the light emitting device package according to the first exemplary embodiment of the present invention and that of a general light emitting device package, in which (a) is the general light emitting device package and (b) is the light emitting device package according to the first exemplary embodiment of the present invention.

With reference to FIGS. 4(a) and 4(b), it is noted that the light emitting device package (b) having the light reflecting resin part containing the high reflective material proposed in the present invention attains an effect of improved luminance compared to the related art light emitting device package (a).

Figure 5:
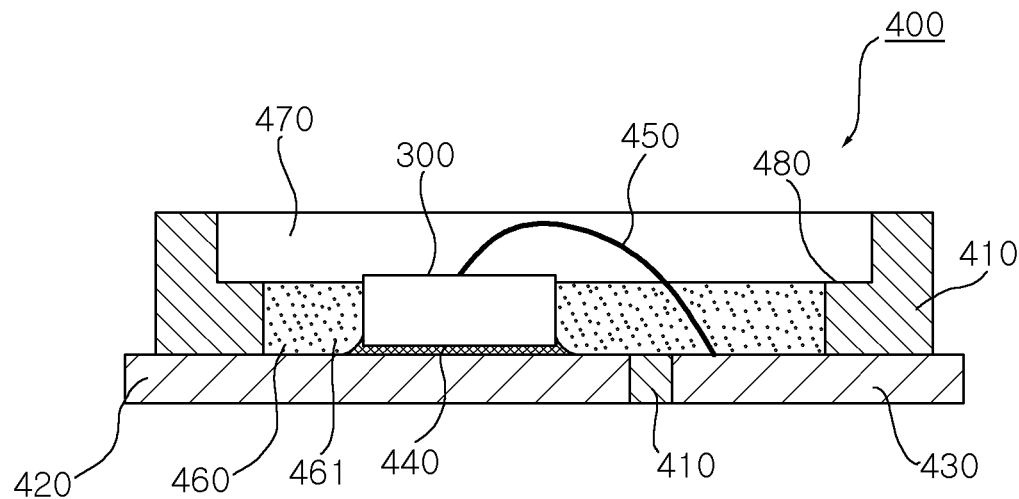
FIG. 5 is a side sectional view schematically showing a light emitting device package according to a second exemplary embodiment of the present invention.

FIG. 5 is a side sectional view schematically showing a light emitting device package according to a second exemplary embodiment of the present invention.

As shown in FIG. 5, a light emitting device package 400 includes a package main body 410 and first and second lead frames 420 and 430 coupled to the package main body 410. The package main body 410 has a cavity in which a light emitting device 300 is mounted. The first and second lead frames 420 and 430 are exposed from a lower surface of the cavity and disposed to face each other. The light emitting device 300 is mounted on the first lead frame 420 through die-bonding. In this case, the two lead frames 420 and 430 are electrically insulated by the package main body 410. A light reflecting resin part 460 and a packing resin part 470 are formed at the inner side of the cavity.

The light emitting device 300 is die-bonded to the first lead frame 420 through a conductive adhesive 440 and electrically connected to the second lead frame 430 by a wire 450. In this case, the first and second lead frames 420 and 430 may be both connected by wires, according to an electrode disposition of the light emitting device 300. Here, any device can be employed as the light emitting device 300 so long as it can be used as a light source, and preferably, a Light Emitting Diode (LED) is employed due to small size and a high efficiency of the light source. The light emitting device 300 may have the same structure as that of the light emitting device 100 described above with reference to FIG. 1. Also, the light emitting device 300 may have a structure in which first and second conductive electrodes are formed on the opposite sides in a vertical direction. This will be described later with reference to FIG. 8.

The package main body 410 has the cavity in which the light emitting device 300 is mounted, and a step portion 480 is formed at the inner side of the cavity. The step portion 480 serves as a display line for filling the light reflecting resin part 460 and has a height smaller than the thickness of the light emitting device 300. Namely, the light reflecting resin part 460 may be filled as high as the side of the light emitting device 300 at its maximum level so as not to cover an upper surface, namely, a light emission surface, of the light emitting device 300.

The light reflecting resin part 460 is made of a mixture obtained by mixing a high reflective material 461 for diffuse-reflecting light generated from the light emitting device 300 and an insulating resin. The insulating resin is a thermosetting resin, and preferably, a silicon resin. The light reflecting resin part 460 is filled to be lower than the thickness of the light emitting device 300 such that it is coated between the side of the light emitting device 300 and a side wall of the step portion 480 and, in this case, the light reflecting resin part 460 may be filled as high as the step portion 480.

Here, the high reflective material 461 has a form of a powder particle and, in this case, the powder particle may have a diameter ranging from 10 nm to 10 μm. In order to have a uniform distribution or dispersion of the high reflective material 461 in an insulating resin, preferably, the high reflective material 461 has a diameter of submicron (1 μm) or smaller. Also, the high reflective material 461 serves to diffuse-reflect light generated from the interior of the light emitting device 300 to allow the light to be discharged to the outside without light absorption by the conductive adhesive, by the resin or by the package main body 410. To this end, the high reflective material 461 preferably has a diffuse reflectance of 70 percent or more with respect to light, and may be $TiO_2$ or $Al_2O_3$.

The high reflective material 461 has electrical insulation characteristics and includes surface-treated particles, namely, coated particles in order to improve dispersibility and restrain a photocatalyst reaction. Namely, if UV or BLUE short wavelength light generated from the interior of the light emitting device 300 is made incident to the light reflecting resin part 460, $TiO_2$ would decompose nearby organic molecules through catalysis, causing a yellowing phenomenon of the resin to thereby potentially degrade luminous efficiency. Also, the high reflective material 261 would lump together, rather than being evenly dispersed in the resin, and sink to the bottom of the cavity, making the resin absorb light to degrade luminous efficiency. Thus, as the high reflective material 261, coated powder particles are used to prevent degradation of dispersibility and the occurrence of yellowing phenomenon of the resin due to the photocatalyst reaction.

Figure 6:
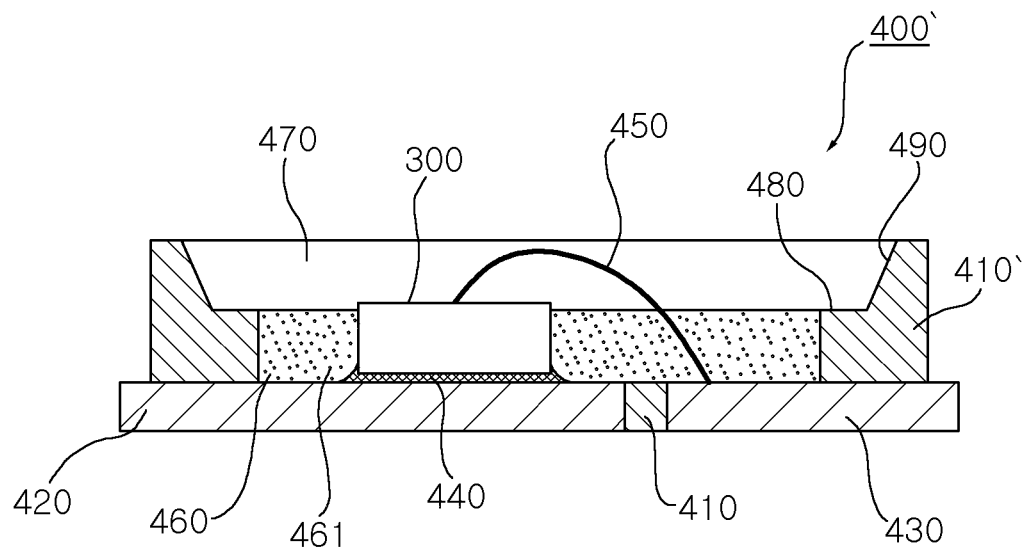
FIG. 6 is side sectional view schematically showing a light emitting device package according to a third exemplary embodiment of the present invention.

FIG. 6 is side sectional view schematically showing a light emitting device package according to a third exemplary embodiment of the present invention. Here, a light emitting device package 400' and its configuration illustrated in FIG. 6 are substantially the same as those of the second exemplary embodiment illustrated in FIG. 5, except that a side wall of a package main body 410' has a sloped reflection face. Thus, a description of the same parts as those of the second exemplary embodiment illustrated in FIG. 5 will be omitted and only a configuration different from the second exemplary embodiment of FIG. 5 will be described.

As shown in FIG. 6, the package main body 410' of a light emitting device package 400' includes a cavity in which the light emitting device 300 is mounted, and the side wall of the cavity has a step portion 480 serving as a display line for filling the light reflecting resin part 460. Also, the cavity is formed to have a reflection face along an inner circumferential surface downwardly sloped toward the light emitting device 300 from the uppermost surface to the step portion 480. The reflection face can reflect light made incident thereon upwardly.

A method for fabricating the light emitting device package according to the second exemplary embodiment of the present invention illustrated in FIG. 5 will now be described with reference to FIGS. 7 and 8. Here, actually, a plurality of light emitting device packages are fabricated, but only the process of forming a single light emitting device package will be described for the sake of brevity.

FIGS. 7a to 7g are side sectional views illustrating a sequential process of a method for fabricating the light emitting device package of FIG. 5, according to the second exemplary embodiment of the present invention.

As shown in FIG. 7(a), a first conductive semiconductor layer 321, an active layer 322, and a second conductive semiconductor layer 323 are sequentially stacked on a growth substrate 310 to form a light emission structure 320.

Here, the light emission structure 320 may be made of a semiconductor material having an empirical formula of $Al_xIn_yGa(1-x-y)N$ (here, $0 \leq x \leq 1$, $0 \leq y \leq 1$, $0 \leq x+y \leq 1$), and may be formed through various deposition and growth methods including Chemical Vapor Deposition (CVD), Metal Organic Chemical Vapor Deposition (MOCVD), Plasma-enhanced Chemical Vapor Deposition (PCVD), Molecular Beam Epitaxy (MBE), Hydride Vapor Phase Epitaxy (HVPE), and the like.

Next, as shown in FIG. 7(b), a conductive substrate 360 is formed on an upper surface of the light emission structure 320. Here, the conductive substrate 360 serves as a second conductive electrode of a final light emitting device and as a support for supporting the light emission structure 320. The conductive substrate 360 may be combined with the light emission structure 320 through a plating or wafer bonding method so as to be formed, and may be one of a Si substrate, an SiAl substrate, an SiC substrate, a ZnO substrate, a GaAs substrate, and a GaN substrate.

Although not essential in the present invention, a high reflective ohmic-contact layer (not shown) may be formed on the second conductive semiconductor layer 323. The high reflective ohmic-contact layer ohmic-contacts with the second conductive semiconductor layer 323 and has high reflexibility. Preferably, the high reflective ohmic-contact layer has a reflexibility of 70 percent or more. For example, the high reflective ohmic-contact layer may be formed as a single layer or a plurality of layers including a metal layer or an alloy layer of at least one selected from the group consisting of Ag, Ni, Al, Ph, Pd, Ir, Ru, Mg, Zn, Pt, Au, and any of their combinations.

Subsequently, as shown in FIG. 7(c), the growth substrate 310 is detached from the light emission structure 320. In this case, the process of detaching the growth substrate 310 may be performed by using a general laser lift-off process or a chemical wet lift-off process.

Then, as shown in FIG. 7(d), a dicing process is performed to separate the conductive substrate 360 and the light emission structure 320 as an individual light emitting device 300, and a first conductive electrode 350 is formed on an upper surface of each of the light emission structures 320.

Thereafter, as shown in FIG. 7(e), a cavity is formed such that it has a step portion on its upper surface, and a package main body 410, to which the first and second lead frames 420 and 430 are coupled to face each other and exposed from a lower surface of the cavity, is prepared, and the light emitting device 300 fabricated as shown in FIG. 7(d) is mounted on the first lead frame 420 exposed from the lower surface of the cavity of the package main body 410. In this case, a lower surface of the conductive substrate of the light emitting device 300 is die-bonded to an upper surface of the first lead frame 420, and a wire 450 is formed to electrically connect the first conductive electrode 350 and the second lead frame 430. The step portion 480 serves as a display line for forming the light reflecting resin part 460 and formed on the lower surface of the cavity such that it has a height smaller than the thickness of the light emitting device 300.

Here, the package main body 410 may be formed as the package main body 410' in which a side wall of the cavity has a reflection face like the light emitting device package 400' illustrated in FIG. 6. In this case, the quantity of light discharged to outside can be further increased by the virtue of the reflection face.

Figure 7:
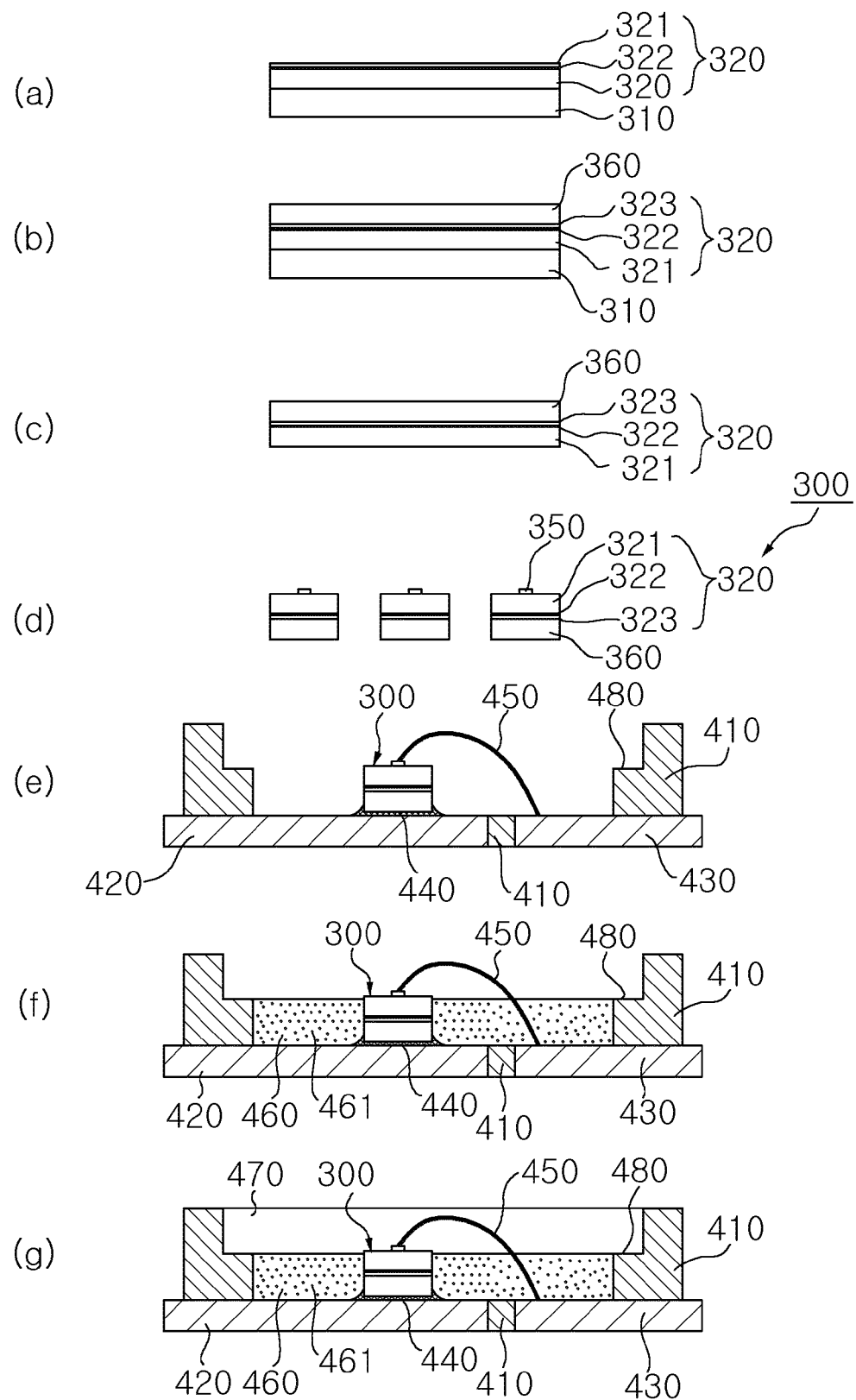
FIGS. 7a to 7g are side sectional views illustrating a sequential process of a method for fabricating the light emitting device package of FIG. 5 according to the second exemplary embodiment of the present invention.

Then, as shown in FIG. 7(*f*), the light reflecting resin part 460 is formed at the inner side of the cavity of the package main body 410. In this case, the light reflecting resin part 460 is coated to be filled between the side of the light emitting device 300 and the side wall of the step portion 480 and is formed to be lower than the thickness of the light emitting device 300. Namely, the light reflecting resin part 460 is filled to extend from the side of the light emitting device 300 as high as the step portion 480 up to the side wall of the step portion 480.

The light reflecting resin part 460 is a resin member obtained by mixing the high reflective material 461 and an insulating resin, in which the high reflective material 461 is evenly distributed or dispersed. The insulating resin is a thermosetting resin, and preferably, a silicon resin.

The high reflective material 461 diffuse-reflects light emitted from the light emitting device 100 to prevent light absorption and discharge the light to outside, and has a form of a powder particle. The size of the powder particle ranges from 10 nm to 10 µm. In order to implement an even or uniform distribution or dispersion of the powder particles in the insulating resin, preferably, the powder particle has a size of submicron (1 µm) or smaller.

As the high reflective material 261, surface-processed particles, namely, coated particles, are used to restrain a photocatalyst reaction to thus improve dispersibility allowing the high reflective material 461 to be uniformly dispersed in the insulating resin, and prevent a yellowing phenomenon of the insulating resin. The high reflective material 261 may be made of $TiO_2$ or $Al_2O_3$.

Subsequently, as shown in FIG. 7(*g*), the packing resin part 470 is formed by hermetically sealing and covering the light emitting device 300 within the cavity of the package main body 410 with the light reflecting resin part 460 coated therein with a transparent resin. In this case, the packing resin part 470 may include a phosphor material or quantum dot. As for the phosphor material, a blue phosphor may be selected from among $(Ba, Sr, Ca)_5(PO_4)_3Cl:(Eu^{2+}, Mn^{2+})$ and $Y_2O_3:(Bi^{3+}, Eu^{2+})$ and used, a nitride-based or sulfide-based red phosphor may be used, one of a silicate-based, a sulfide-based, and a nitride-based green phosphor may be used, and a YAG or TAG-based garnet phosphor may be used as a yellow phosphor. The quantum dot represents colors from blue to red by adjusting the size of nano-particles and may be II-VI group compound semiconductor nano-crystal such as CdS, CdSe, CdTe, ZnS, ZnSe, ZnTe, HgS, HgSe, and HgTe. Accordingly, the packing resin part 270 can convert the wavelength of light emitted from the light emitting device 100 into white light by using the phosphor material or the quantum dot.

In this manner, the light reflecting resin part 460 is coated on the lower surface of the cavity of the package main body 410 and on the side of the light emitting device 300, whereby light discharged from the active layer 322 of the light emitting device 300 can be prevented from being absorbed by the conductive adhesive, the resin member, the package main body, and the like, and because the discharged light collides with the high reflective material 461 so as to be diffuse-reflected, the quantity of light discharged to outside can be increased to improve a luminous efficiency.

FIGS. 8*a* to 8*e* are side sectional views illustrating a sequential process of a method for fabricating the light emitting device package of FIG. 5, according to the second exemplary embodiment of the present invention. Here, the light emitting device package, according to the second exemplary embodiment of the present invention, employs a light emitting device 500 having a structure in which first and second conductive electrodes 540 and 550 are formed on the same surface. The process of fabricating the light emitting device package 400 Illustrated in FIG. 8 is substantially the same as that of FIG. 7, so a description of the same configuration will be omitted and only a different configuration will be described.

Figure 8:
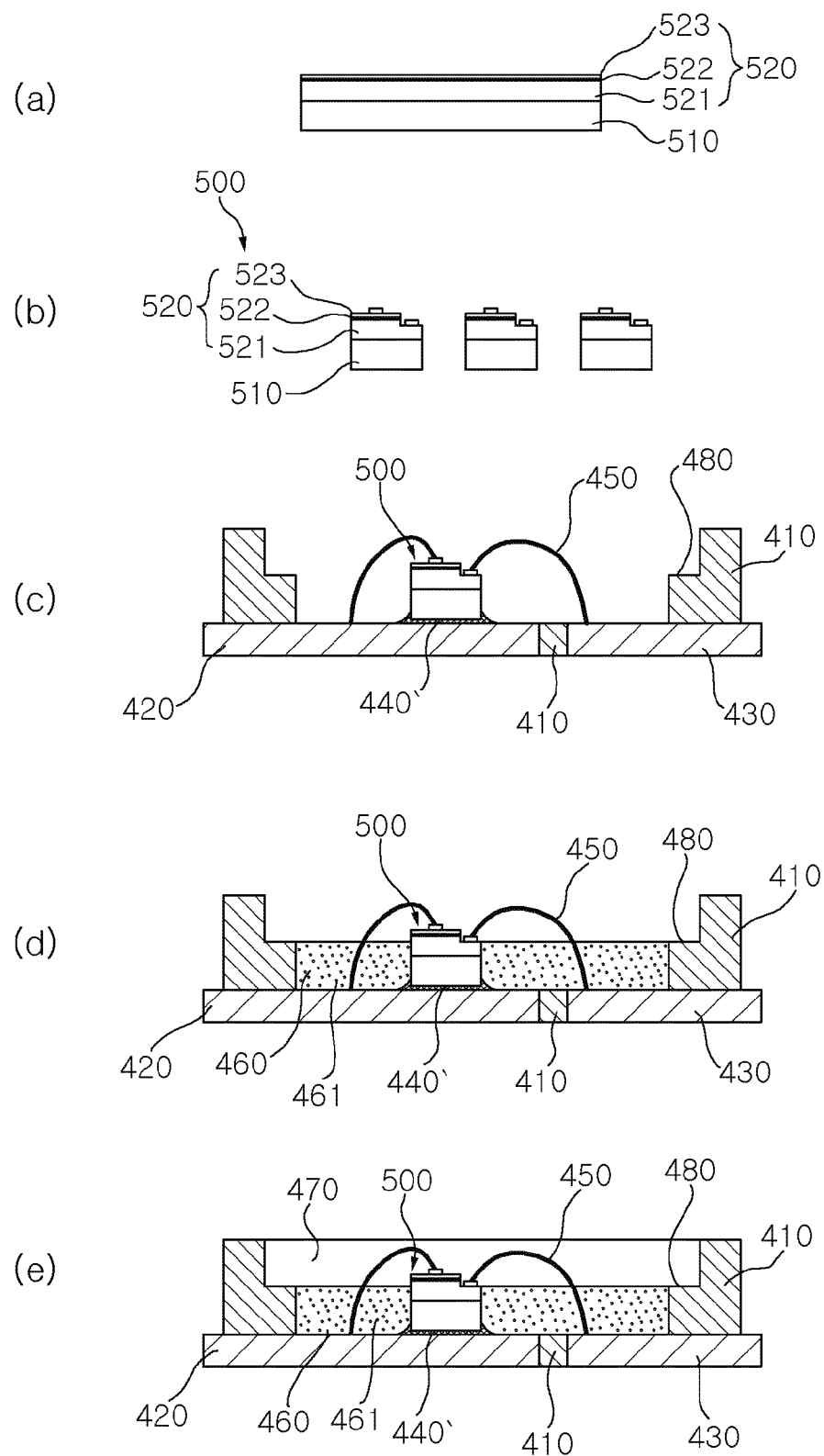
FIGS. 8a to 8e are side sectional views illustrating a sequential process of a method for fabricating the light emitting device package of FIG. 5 according to the second exemplary embodiment of the present invention.

First, as shown in FIG. 8(*a*), a first conductive semiconductor layer 521, an active layer 522, and a second conductive semiconductor layer 523 are sequentially stacked on a growth substrate 510 to form a light emission structure 520.

Next, as shown in FIG. 8(*b*), the active layer 522 and the second conductive semiconductor layer of the light emission structure 520 are partially removed through mesa etching to expose a portion of the first conductive semiconductor layer 521. A first conductive electrode 550 is formed on the first conductive semiconductor layer 521 exposed through the mesa etching, and the second conductive electrode 540 is formed on the second conductive semiconductor layer 523. A dicing process is performed on the structure formed thusly to separate individual light emitting devices 500.

Subsequently, as shown in FIG. 8(*c*), a cavity is formed such that it has a step portion 480 on its upper surface, and the package main body 410, to which the first and second lead frames 420 and 430 are coupled to face each other and exposed from a lower surface of the cavity, is prepared, and the light emitting device 500 fabricated as shown in FIG. 8(*b*) is mounted on the first lead frame 420 exposed from the lower surface of the cavity of the package main body 410. In this case, a lower surface of the growth substrate of the light emitting device 300 is die-bonded to the upper surface of the first lead frame 420, and a wire 450 is formed to electrically connect the first conductive electrode 530 and the second lead frame 430, and the second conductive electrode 540 and the first lead frame 520, respectively. The step portion 480 serves as a display line for forming the light reflecting resin part 460 and formed on the lower surface of the cavity such that it has a height smaller than the thickness of the light emitting device 300, so that the light reflecting resin part 460 may not cover the upper surface, namely, the light emission surface, of the light emitting device 500.

Here, the package main body 410 may be formed as the package main body 410' in which a side wall of the cavity has a reflection face like the light emitting device package 400' illustrated in FIG. 6. In this case, the quantity of light discharged to outside can be further increased by the virtue of the reflection face.

Thereafter, as shown in FIG. 8(*d*), the light reflecting resin part 460 is formed at the inner side of the cavity of the package main body 410. In this case, the light reflecting resin part 460 is coated to be filled between the side of the light emitting device 500 and the side wall of the step portion 480 and is formed to be lower than the thickness of the light emitting device 500. The light reflecting resin part 460 is a resin member formed by mixing the high reflective material 461 and an insulating resin. The high reflective material 461 is evenly distributed or dispersed in the light reflecting resin part 460.

Subsequently, as shown in FIG. 8(*e*), the packing resin part 470 is formed by hermetically sealing and covering the light emitting device 300 within the cavity of the package main body 410 with the light reflecting resin part 460 coated therein with a transparent resin. In this case, the packing resin part 470 may include a phosphor material or quantum dot. The packing resin part 270 can convert the wavelength of light emitted from the light emitting device 100 into white light by using the phosphor material or the quantum dot.

Figure 9:
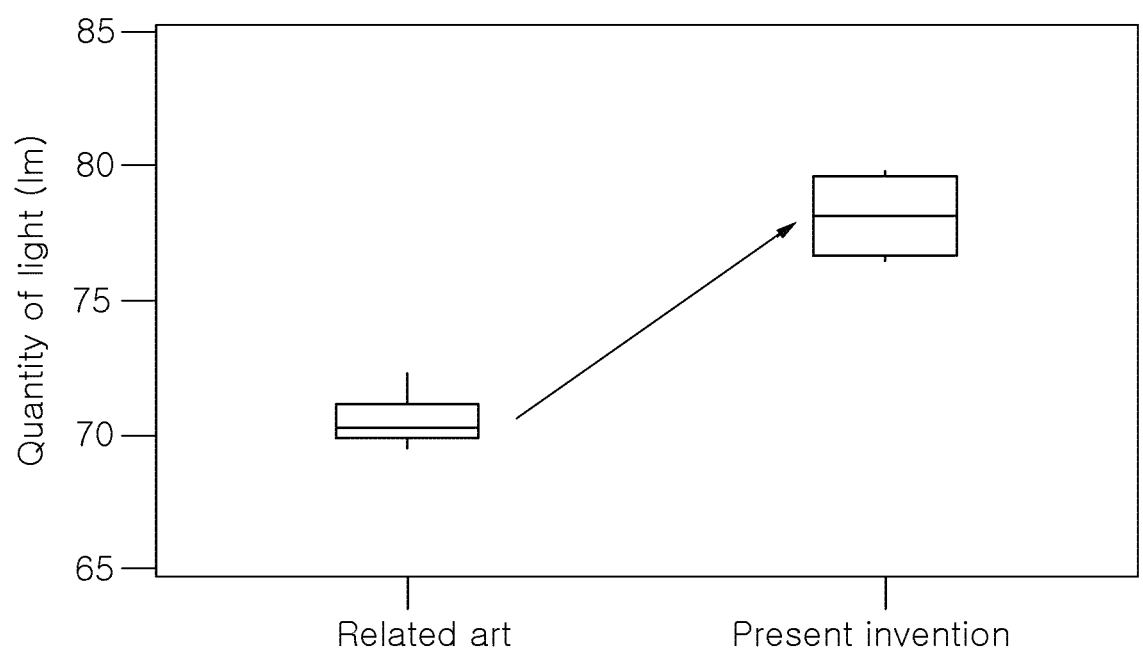
FIG. 9 is a graph showing an effect of improvement of a light extraction efficiency of the light emitting device package according to the second exemplary embodiment of the present invention.

FIG. 9 is a graph showing an effect of the improvement of a light extraction efficiency of the light emitting device package according to the second exemplary embodiment of the present invention. Here, the related art general light emitting device package includes only a packing resin part. As shown in FIG. 9, the related art general light emitting device package has the quantity of light of 70.1 lm at a driving current of 350 mA, while the light emitting device package according to an exemplary embodiment of the present invention has the quantity of light of 78.1 lm at the driving current of 350 mA. Thus, it is noted that the light reflecting resin part of the present invention can obtain the effect of improving the light extraction efficiency by 10.8 percent compared with the related art.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device package comprising:
   a substrate with a mounting surface;
   a light emitting device bonded to the mounting surface of the substrate;
   a light reflecting resin part containing a high reflective material, formed in a space between the light emitting device and the substrate, and extending from a region formed at the space so as to be formed on the substrate around the light emitting device; and
   a packing resin part hermetically sealed to cover the light emitting device and the light reflecting resin part.

2. The light emitting device package of claim 1, wherein the light reflecting resin part is formed on an area of 50 percent or more when compared to the entire area of the substrate excluding the region on which the light emitting device is bonded.

3. The light emitting device package of claim 2, wherein the light reflecting resin part is formed on a front surface of the substrate.

4. The light emitting device package of claim 1, wherein the light reflecting resin part is formed to also cover the side surface of the light emitting device.

5. The light emitting device package of claim 1, wherein the substrate is a sub mount substrate.

6. The light emitting device package of claim 1, wherein the light emitting device comprises:
   a light emission structure including a first conductive semiconductor layer, an active layer, and a second conductive semiconductor layer which are sequentially formed on a growth substrate and having a mesa structure in which a portion of the first conductive semiconductor layer is exposed;
   a first conductive electrode formed on the exposed portion of the first conductive semiconductor; and
   a second conductive electrode formed on the second conductive semiconductor layer.

7. The light emitting device package of claim 6, further comprising:
   a high reflective ohmic-contact layer formed on the second conductive semiconductor layer.

8. The light emitting device package of claim 6, further comprising:
   a bonding pad formed on the substrate; and
   a metal bump formed on the bonding pad and electrically connected with the first and second conductive electrodes.

9. The light emitting device package of claim 8, wherein the substrate further comprises a conductive via electrically connected with the bonding pad.

10. A light emitting device package comprising:
    a package main body having a cavity;
    first and second lead frames coupled with the package main body such that the first and second lead frames are exposed from a lower surface of the cavity and face each other;
    at least one light emitting device mounted on one surface of the first and second lead frames;
    a wire electrically connecting a lead frame among the first and second lead frames where the light emitting device is not mounted and the light emitting device;
    a light reflecting resin part coated with a thickness smaller than that of the light emitting device between a side surface of the light emitting device and a side wall of the cavity and containing a high reflective material; and
    a packing resin part hermetically sealed at an inner side of the cavity to cover the light emitting device.

11. The light emitting device package of claim 10, wherein the cavity has a step portion.

12. The light emitting device package of claim 11, wherein the step portion has a height smaller than the thickness of the light emitting device.

13. The light emitting device package of claim 10, wherein the light emitting device comprises:
    a light emission structure including a first conductive semiconductor layer, an active layer, and a second conductive semiconductor layer which are sequentially stacked;
    a conductive substrate formed on the second conductive semiconductor layer; and
    a first conductive electrode formed on a lower surface of the first conductive semiconductor layer.

14. The light emitting device package of claim 10, wherein the light emitting device comprises:
    a light emission structure including a first conductive semiconductor layer, an active layer, and a second conductive semiconductor layer which are sequentially formed on a growth substrate and having a mesa structure in which a portion of the first conductive semiconductor layer is exposed;
    a first conductive electrode formed on the exposed portion of the first conductive semiconductor; and
    a second conductive electrode formed on the second conductive semiconductor layer.

15. The light emitting device package of claim 10, wherein the light reflecting resin part comprises the high reflective material so as to have a diffusion reflectance of 70 percent or larger.

16. The light emitting device package of claim 10, wherein the high reflective material has electrical insulation characteristics.

17. The light emitting device package of claim 10, wherein the high reflective material is $TiO_2$ or $Al_2O_3$.

18. The light emitting device package of claim 10, wherein the high reflective material is powder particles.

19. The light emitting device package of claim 18, wherein the powder particles are coated to restrain a photocatalyst reaction.

20. The light emitting device package of claim 10, wherein the packing resin part comprises a phosphor material or a quantum dot.

21. A method for fabricating a light emitting device package, the method comprising:
    sequentially forming a bonding pad and a metal bump on a substrate;

flipchip-bonding a light emitting device on the metal bump;

forming a light reflecting resin part containing a high reflective material, filling a space between the light emitting device and the substrate, and extending to the vicinity of the light emitting device on the substrate, forming a packing resin part to cover the light emitting device and the light reflecting resin part; and dicing the substrate so as to be separated into individual light emitting device packages.

22. The method of claim 21, wherein, in forming the light reflecting reflection resin part, the light reflecting resin part is formed on an area of 50 percent or more when compared to the entire area of the substrate excluding the region on which the light emitting device is bonded.

23. The method of claim 22, wherein, in forming the light reflecting resin part, the light reflecting resin part is formed on a front surface of the substrate.

24. The method of claim 21, wherein, in forming the light reflecting resin part, the light reflecting resin part is formed to also cover a side surface of the light emitting device.

25. A method for fabricating a light emitting device package, the method comprising:

preparing a package main body having a cavity;

coupling first and second lead frames to the package main body such that they are exposed from a lower surface of the cavity and face each other;

mounting a light emitting device on an upper surface of one of the first and second lead frames through die bonding;

forming a wire to electrically connect the light emitting device with a lead frame on which the light emitting device is not mounted among the first and second lead frames;

forming a light reflecting resin part containing a high reflective material with a thickness smaller than that of the light emitting device such that the light reflecting resin part is coated on a side surface of the light emitting device and on a side wall of the cavity; and forming a packing resin part at an inner side of the cavity to cover the light emitting device.

26. The method of claim 25, wherein, in preparing the package main body, the cavity is formed to have a step portion.

27. The method of claim 26, wherein the step portion is formed to have a height not larger than the thickness of the light emitting device from the lower surface of the cavity.

28. The method of claim 25, wherein the high reflective material is $TiO_2$ or $Al_2O_3$.

29. The method of claim 25, wherein the high reflective material is powder particles.

30. The method of claim 29, wherein the powder particles are coated to restrain a photocatalyst reaction.

31. The method of claim 25, wherein the packing resin part comprises a phosphor material or a quantum dot.

32. The method of claim 25, further comprising:

applying heat to harden the light reflecting resin part and the packing resin part after forming the light reflecting resin part and forming the packing resin part.

* * * * *